(12) United States Patent
Donaldson et al.

(10) Patent No.: US 6,875,054 B2
(45) Date of Patent: Apr. 5, 2005

(54) CONTAMINATION PREVENTION BETWEEN TWO ELECTRICAL COMPONENTS

(75) Inventors: David Donaldson, Greenville, TX (US); Alexis Neal, Garland, TX (US); Paul Scott Nessman, Dallas, TX (US); Steven John Vargo, Midlothian, TX (US)

(73) Assignee: Tyco Electronics Power Systems Inc., Mesquite, TX (US)

( * ) Notice: Subject to any disclaimer, the term of this patent is extended or adjusted under 35 U.S.C. 154(b) by 0 days.

(21) Appl. No.: 10/190,466

(22) Filed: Jul. 5, 2002

(65) Prior Publication Data

US 2004/0005813 A1 Jan. 8, 2004

(51) Int. Cl.[7] ......................... H01R 13/40; H01R 13/52
(52) U.S. Cl. ..................................... 439/587; 439/271
(58) Field of Search ............................... 439/587, 591, 439/271, 278, 204, 426, 936; 174/76

(56) References Cited

U.S. PATENT DOCUMENTS

| | | | | |
|---|---|---|---|---|
| 4,072,382 A | * | 2/1978 | Reschke | 439/143 |
| 4,875,870 A | * | 10/1989 | Hardy et al. | 439/204 |
| 5,588,856 A | * | 12/1996 | Collins et al. | 439/204 |
| 5,934,922 A | * | 8/1999 | Chiotis | 439/204 |
| 6,168,454 B1 | * | 1/2001 | Dzwonczyk | 439/381 |
| 6,270,363 B1 | * | 8/2001 | Brofman et al. | 439/91 |
| 6,361,341 B1 | * | 3/2002 | Okayasu et al. | 439/271 |
| 6,364,692 B1 | * | 4/2002 | Okayasu et al. | 439/426 |
| 6,435,910 B1 | * | 8/2002 | Blasko et al. | 439/587 |
| 2001/0041468 A1 | * | 11/2001 | Zweigle et al. | 439/135 |
| 2002/0102874 A1 | * | 8/2002 | Hobson et al. | 439/271 |

* cited by examiner

*Primary Examiner*—Chandrika Prasad
(74) *Attorney, Agent, or Firm*—Law Office of Donald D. Mondul

(57) ABSTRACT

An apparatus for effecting an improved electrical connection structure between a component and a substrate in an installed orientation is employed where the component presents at least one electrical connection lead for establishing the electrical connection. The apparatus includes a mass of compressible dielectric material substantially fixedly situated between the component and the substrate in the installed orientation in substantially surrounding relation about the at least one electrical connection lead and substantially in register with the component.

12 Claims, 3 Drawing Sheets

CONTAMINATION PREVENTION BETWEEN TWO ELECTRICAL COMPONENTS

BACKGROUND OF THE INVENTION

The present invention is directed to an apparatus and method for effecting an improved electrical connection structure between a first electrical component and a second electrical component. The present invention may be employed to advantage in electrically coupling electrical devices with electrical devices as well as in coupling electrical devices with printed circuit board circuitry carried on a substrate.

Electrical components, such as a component and an electrical circuit board or two electrical devices, are commonly electrically coupled using electrical lead structures to establish desired electrical connections. A consequence of employing such electrical leads in effecting coupling is that there is a space established between the components in their installed orientation. That is, there is an inter-component volume defined between the coupled components that presents a locus for collecting contamination such as dust, metal particles, ceiling tile debris and other contaminants from the manufacturing environment and from the operating environment in which the product is located during various intervals of its life. Such contaminants can collect to sufficient amounts during the life of a product to have a deleterious affect on the operation of the product or even to preclude operation of the product. In particular, product failure often results from such contamination because the contaminants are conductive, or the contaminants harbor moisture, or because of a combination of the contaminants being conductive and harboring moisture.

Such problems caused by a build up of contaminants in inter-component loci have been recognized and some efforts have been made to ameliorate the problem and its effects. Some manufacturers have employed conformal coatings including crack filling foams, potting materials or other similar materials. Such approaches to solving the problem of inter-component contamination add expense to manufacturing a product because of the cost of the materials employed, labor required for applying the materials, cure time or other processing times necessitated by employing the materials, chemical disposal costs associated with the materials used, difficulty of rework and repair and other factors. Another attempt at solving the problem of inter-component contamination has been to employ a protective tubing on at least one lead that connects components. By way of example, a woven glass tubing may be installed in surrounding relation with one of the inter-component leads to protect the lead from shorting through or by contaminants. A significant drawback of such an attempted solution is that the tubing is difficult to install, thereby adding to labor costs of production. Further the tubing provides protection to only those leads that are equipped with the tubing; if increased protection for a product is sought by applying more tubing to more leads, labor costs increase.

There is a need for an apparatus and method for effecting an improved connection structure between components that resists contamination build up between the components.

There is also a need for an apparatus and method for effecting an improved connection structure between components that is inexpensive and easy to employ.

SUMMARY OF THE INVENTION

An apparatus for effecting an improved electrical connection structure between a first component and a second component in an installed orientation is advantageously employed where at least one of the components presents at least one electrical connection lead for establishing the electrical connection. The apparatus includes a mass of compressible dielectric material substantially fixedly situated between the first component and the second component in the installed orientation in substantially surrounding relation about the at least one electrical connection lead.

A method for effecting an improved electrical connection structure between a first component and a second component may also be employed advantageously where at least one of the components presents at least one electrical connection lead for establishing the electrical connection between the first component and the second component in an installed orientation. The method includes the steps of: (a) in no particular order: (1) providing a mass of compressible dielectric material; and (2) orienting the first component and the second component in a spaced relation; (b) situating the mass between the first component and the second component; (c) urging the first component and the second component together toward the installed orientation; and (d) effecting a coupling action with the at least one electrical connection lead to electrically engage the first component and the second component in the installed orientation with the mass in substantially surrounding relation about the at least one electrical connection lead.

It is, therefore, an object of the present invention to provide an apparatus and method for effecting an improved connection structure between components that resists contamination build up between the components.

It is a further object of the present invention to provide apparatus and method for effecting an improved connection structure between components that is inexpensive and easy to employ.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
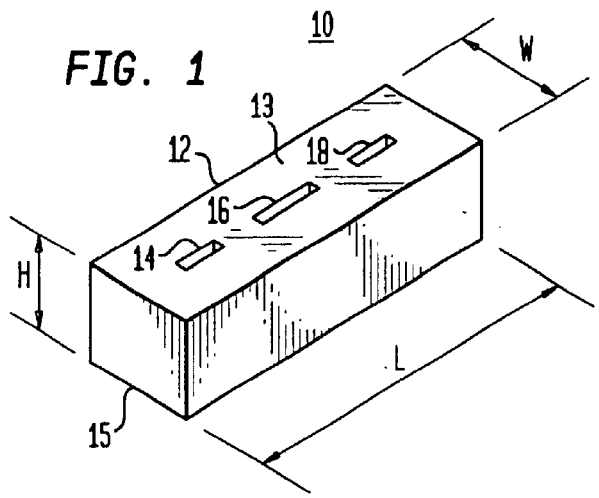
FIG. 1 is a perspective view of the preferred embodiment of the present invention.
Figure 3:
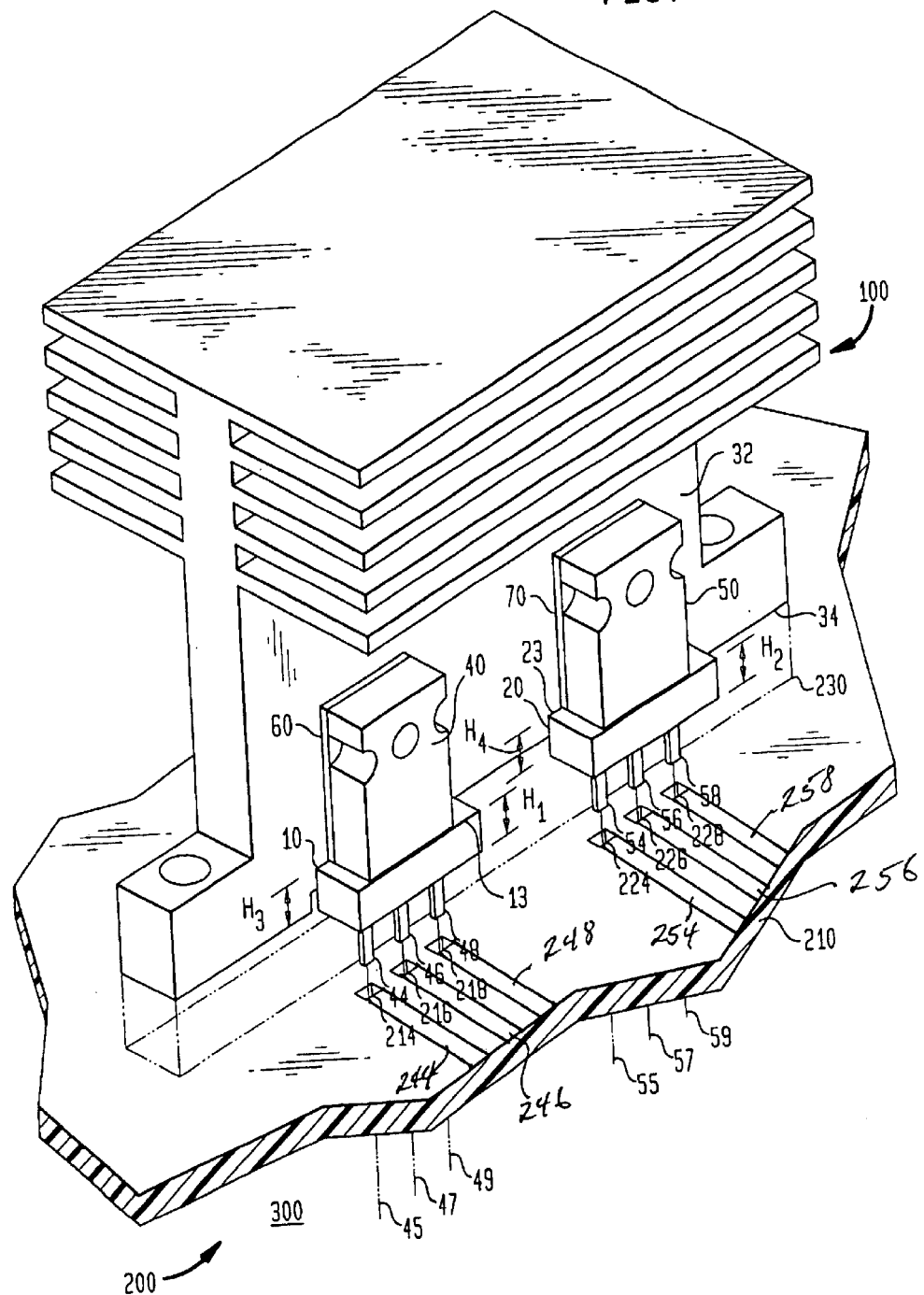
FIG. 3 is an exploded perspective view of the subassembly of electrical components illustrated in FIG. 2 poised for assembly with a printed circuit board subassembly to establish a product.

FIG. 1 is a perspective view of the preferred embodiment of the present invention. In FIG. 1, an apparatus 10 for effecting an improved connection structure between electrically coupled components is preferably embodied in a mass or volume 12 of compressible dielectric material having a length L, a width W and a height H. Mass 12 is illustrated in its preferred embodiment having a plurality of apertures 14, 16, 18 provided for receiving electrical leads (not shown in FIG. 1) for effecting electrical connection between components between which mass 12 is situated (not shown in FIG. 1). Mass 12 is preferably dimensioned to present a length L and a width W to establish opposing faces 13, 15 that are generally in register with adjacent components with which mass 12 is employed in an installed orientation (FIG. 3). Further, mass 12 is preferably dimensioned to present a height H that is substantially equal with or somewhat greater than the separation between adjacent components with which mass 12 is employed in the installed orientation (FIG. 3). Mass 12 may be embodied in an incompressible material if desired.

Figure 2:
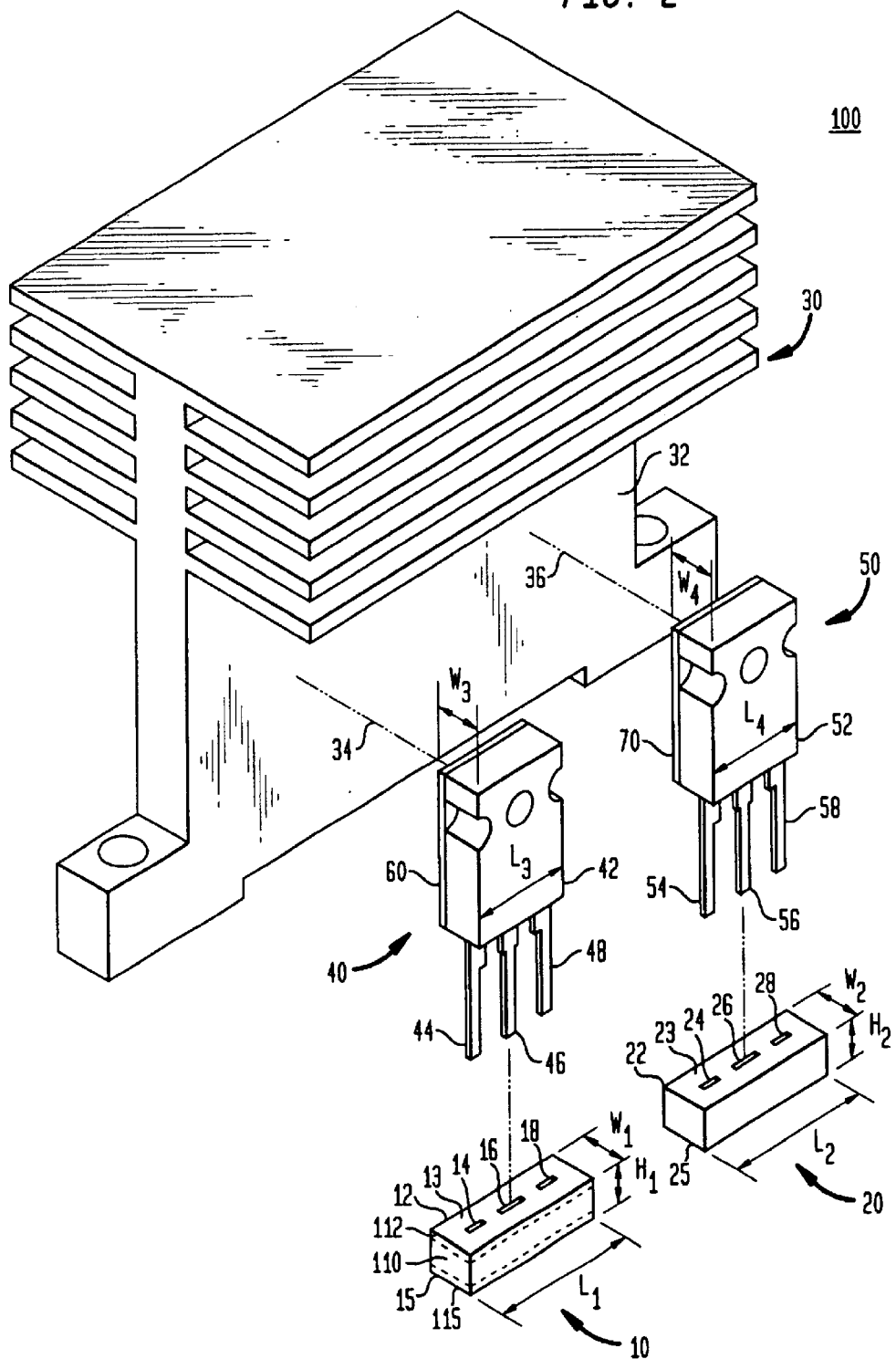
FIG. 2 is an exploded perspective view of a representative subassembly of electrical components in an interim position for assembly using the apparatus of the present invention illustrated in FIG. 1.

FIG. 2 is an exploded perspective view of a representative subassembly of electrical components in an interim position for assembly using the apparatus of the present invention illustrated in FIG. 1. In FIG. 2, a subassembly 100 includes an apparatus 10 and an apparatus 20 for effecting an improved connection structure between electrically coupled components or subassemblies. Subassembly 100 further includes a heat sink 30 and components 40, 50. Components 40, 50 may be, for example, transistor components. Subassembly 100 further includes mounting components 60, 70 for effecting mounting of components 40, 50 upon heat sink 30. Mounting components 60, 70 are preferably electrically insulative thermally conductive components for enhancing thermal transfer between components 40, 50 and heat sink 30.

Component 40 includes a component body 42 containing electrical circuitry (not shown in detail in FIG. 2) and electrical connection leads 44, 46, 48. Component 40 has a length $L_3$ and a combined width (with mounting component 60) of $W_3$. Component 50 includes a component body 52 containing electrical circuitry (not shown in detail in FIG. 2) and electrical connection leads 54, 56, 58. Component 50 has a length $L_4$ and a combined width (with mounting component 70) of $W_4$. Components 40, 50 are poised in FIG. 2 for mounting upon a face 32 of heat sink 30 (as indicated by dotted lines 34, 36) with mounting components 60, 70 between face 32 and component bodies 42, 52.

Apparatuses 10, 20 are configured substantially as described in connection with apparatus 10 (FIG. 1). Thus, apparatuses 10, 20 are preferably embodied in masses 12, 22 of compressible dielectric material. If desired, apparatuses 10, 20 may be at least partially compressible. For example, apparatus 10 may include a central portion 110 and one or both of outer portions 112, 115. Any of portions 110, 112, 115 may be incompressible or compressible, so long as at least one of portions 110, 112, 115 is compressible. Thus, apparatus 10 may have an incompressible core portion 110 with one or two compressible face portions 112, 115. Alternatively, apparatus 10 may have one or two incompressible face portions 112, 115 with a compressible core portion 110. For purposes of this application, the term "compressible" is intended to indicate that an element, such as apparatus 10, is at least partially compressible. Apparatus 10 has a length $L_1$, a width $W_1$ and a height $H_1$. Apparatus 20 has a length $L_2$, a width $W_2$ and a height $H_2$. Masses 12, 22 are illustrated in their preferred embodiments. Thus, mass 12 has a plurality of apertures 14, 16, 18 provided for receiving electrical leads 44, 46, 48 of component 40 for effecting electrical connection between components or subassemblies (not shown in FIG. 2) in an installed orientation (FIG. 3).

Mass 12 is preferably dimensioned so that length $L_1$ is generally in register with length $L_3$ of component 40 in an installed orientation. Mass 12 is further preferably dimensioned so that width $W_1$ is generally in register with combined width $W_3$ of component body 42 and mounting component 60 in an installed orientation. Still further mass 12 is preferably dimensioned so that height $H_1$ is substantially equal with or somewhat greater than the separation between adjacent components or subassemblies with which it is employed in its installed orientation in a product (FIG. 3). Mass 22 is preferably dimensioned so that length $L_2$ is generally in register with length $L_4$ of component 50 in an installed orientation. Mass 22 is further preferably dimensioned so that width $W_2$ is generally in register with combined width $W_4$ of component body 52 and mounting component 70 in an installed orientation. Still further mass 22 is preferably dimensioned so that height $H_2$ is substantially equal with or somewhat greater than the separation between adjacent components or subassemblies with which it is employed in its installed orientation in a product (FIG. 3).

Alternatively, electrical leads 44, 46, 48, 54, 56, 58 may be configured with sufficient high rigidity and appropriately low cross sections to facilitate piercing of masses 12, 22 by electrical leads 44, 46, 48, 54, 56, 58 by urging apparatuses 10, 20 and components 40, 50 together. In such an alternate configuration, apertures 14, 16, 18, 24, 26, 28 are not provided. During assembly using such an alternate embodiment of apparatuses 10, 20 and electrical leads 44, 46, 48, 54, 56, 58, apparatuses 10, 20 and components 40, 50 are urged together. Pursuant to such an urging together, electrical leads 44, 46, 48 initially piercingly engage apparatus 10 at an adjacent side 13 of apparatus 10. Height $H_1$, of apparatus 10 is appropriately selected so that electrical leads 44, 46, 48 can piercingly pass through apparatus 10 sufficiently to present enough length of electrical leads 44, 46, 48 to establish electrical connection with an electrical component or subassembly situated on opposite side 15 of apparatus 10 from adjacent side 13 at which initial piercing occurs. Further pursuant to such an urging together, electrical leads 54, 56, 58 initially piercingly engage apparatus 20 at an adjacent side 23 of apparatus 20. Height $H_2$, of apparatus 20 is appropriately selected so that electrical leads 54, 56, 58 can piercingly pass through apparatus 20 sufficiently to present enough length of electrical leads 54, 56, 58 to establish electrical connection with an electrical component or subassembly situated on opposite side 25 of apparatus 20 from adjacent side 23 at which initial piercing occurs.

FIG. 3 is an exploded perspective view of the subassembly of electrical components illustrated in FIG. 2 poised for assembly with a printed circuit board subassembly to establish a product. In FIG. 3, a product 300 includes a subassembly 100 (described in detail in connection with FIG. 2) and a subassembly 200. Subassembly 200 includes a substrate 210 on which are borne a plurality of circuit traces 244, 246, 248, 254, 256, 258 for effecting electrical connections among a plurality of electrical devices or subassemblies, such as subassembly 100. Substrate 210 presents a mounting aperture 214 for receiving electrical lead 44 along an axis 45 for effecting electrical connection with circuit trace 244, a mounting aperture 216 for receiving electrical lead 46 along an axis 47 for effecting electrical connection with circuit trace 246 and a mounting aperture 218 for receiving electrical lead 48 along an axis 49 for effecting electrical connection with circuit trace 248. Substrate 210 also presents a mounting aperture 224 for receiving electrical lead 54 along an axis 55 for effecting electrical connection with circuit trace 254, a mounting aperture 226 for receiving electrical lead 56 along an axis 57 for effecting electrical connection with circuit trace 256 and a mounting aperture 228 for receiving electrical lead 58 along an axis 59 for effecting electrical connection with circuit trace 256. In FIG. 3, subassembly 100 is in an assembled orientation with component 40 affixed to face 32 of heat sink 30 with mounting component 60 captively situated between component 40 and face 32. In its assembled orientation subassembly 100 situates apparatus 10 with top face 13 at a height $H_3$ above bottom edge 34 of heat sink 30. In its assembled orientation, subassembly 100 also has component 50 affixed to face 32 of heat sink 30 with mounting component 70 captively situated between component 50 and face 32. In its assembled orientation subassembly 100 situates apparatus 20 with top face 23 at a height $H_4$ above bottom edge 34 of heat sink 30.

Combining subassemblies 100, 200 together places product 300 in an assembled or installed orientation. In its installed orientation, product 300 has heat sink 30 abutting substrate 210 in an abutment area or footprint indicated by dotted line 230 with electrical leads 44, 46, 48 passing through substrate 210 through mounting apertures 214, 216, 218 and with electrical leads 54, 56, 58 passing through substrate 210 through mounting apertures 224, 226, 228. Installation of subassemblies 100, 200 to complete assembly of product 300 is effected by electrically coupling subassemblies 100, 200 using any of various coupling techniques know in the art of electrical product manufacturing, for example (and not by way of limitation) reflow soldering, wave soldering, vapor phase reflow soldering, conductive epoxy or other coupling technologies.

Preferably, heights $H_1$, $H_2$ of apparatuses 10, 20 are substantially equal with heights $H_3$, $H_4$ at which top faces 13, 23 of apparatuses 10, 20 are situated above bottom edge 34 of face 32 of heat sink 30. Most preferably, heights $H_1$, $H_2$ of apparatuses 10, 20 are slightly greater than heights $H_3$, $H_4$ so that apparatuses 10, 20 are somewhat compressed between substrate 210 and components 40, 50 when product 300 is assembled. Such compression of apparatuses 10, 20 between components 40, 50 and substrate 210 assures that the inter-component spaces or volumes between components 40, 50 and substrate 210 are fully occupied by apparatuses 10, 20, thereby denying ingress to the inter-component volume by contaminants or moisture.

Apparatuses 10, 20 may be embodied in individually dimensioned units configured for each product in which they are to be employed, with a particular height, length and width appropriate for each respective product and with apertures (e.g., apertures 14, 16, 18; FIG. 1) appropriately spaced and dimensioned for receiving electrical leads (e.g., electrical leads 44, 46, 48; FIG. 2). Alternatively, apparatuses 10, 20 may be fashioned in sizes appropriate for stacking so that a few selected sizes of apparatuses 10, 20 may be employed to advantage in installing a variety of components. In such an arrangement, apparatuses 10, 20 may be configured with apertures or without apertures. In configuring apparatuses 10, 20 without apertures, it would be advantageous to configure electrical leads (e.g., electrical leads 44, 46, 48, 54, 56, 58; FIG. 2) with sufficient high rigidity and appropriately low cross sections to facilitate piercing of apparatuses 10, 20 by urging apparatuses 10, 20 and components 40, 50 together during installation or assembly.

Figure 4:
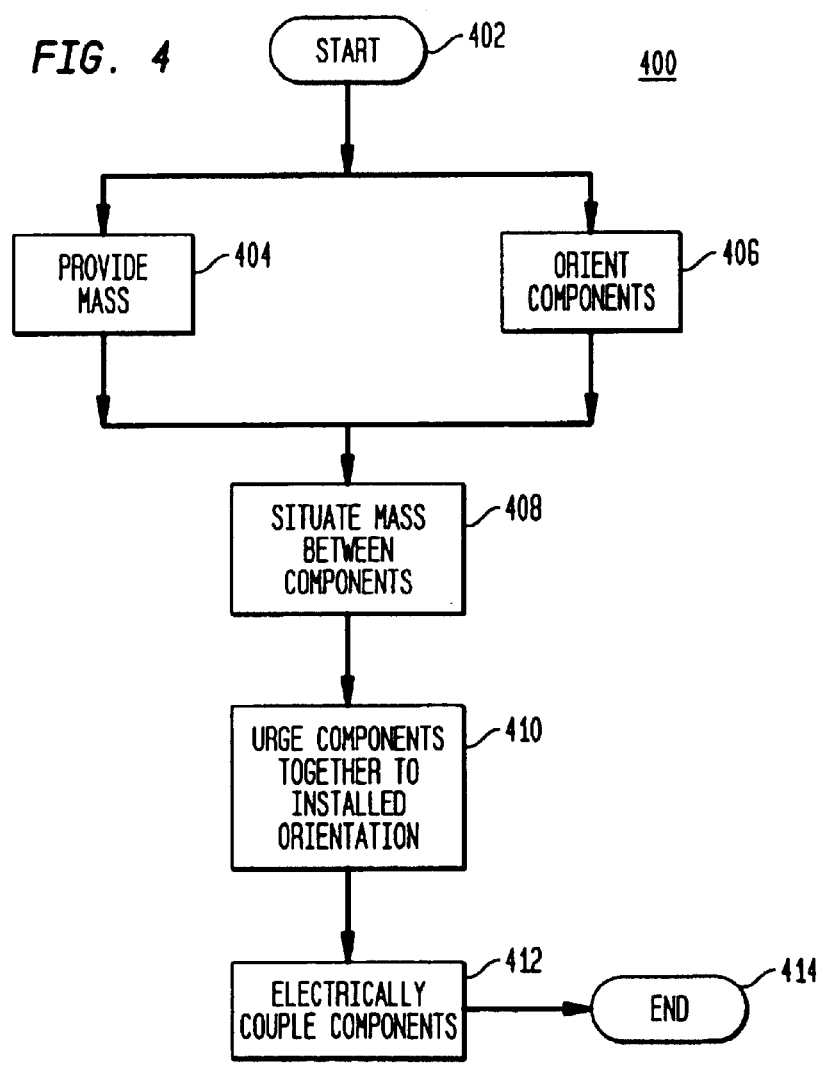
FIG. 4 is a flow chart illustrating the method of the present invention.

FIG. 4 is a flow chart illustrating the method of the present invention. In FIG. 4, a method 400 for effecting an improved electrical connection structure between a first component and a second component begins at a START locus 402. At least one component of the first component and the second component presents at least one electrical connection lead for establishing the electrical connection between the first component and the second component in an installed orientation. Method 400 proceeds from START locus 402 to, in no particular order: (1) provide a mass of compressible dielectric material, as indicated by a block 404; and (2) orient the first component and the second component in a spaced relation, as indicated by a block 406.

Method 400 continues with situating the mass between the first component and the second component, as indicated by a block 408, and urging the first component and the second component together toward the installed orientation, as indicated by a block 410. Method 400 continues with effecting a coupling action with the at least one electrical connection lead to electrically engage the first component and the second component in the installed orientation with the mass in substantially surrounding relation about the at least one electrical connection lead, as indicated by a block 412. Method 400 thereafter terminates, as indicated by an END locus 414.

Method 400 may effect situating the mass (block 408) by affixing the mass to one component of the first component and the second component. Method 400 may result in the first component and the second component generally defining an inter-component volume between the first component and the second component in the installed orientation, and method 400 may provide that the mass substantially fills the inter-component volume in the installed orientation.

Method 400 may further provide that the at least one electrical connection lead is a generally rod-shaped structure and that the at least one electrical connection lead piercingly engages the mass during urging the first component and the second component together toward the installed orientation.

Method 400 may still further provide that the mass substantially abuts the first component by a first mass face and substantially abuts the second component by a second mass face in the installed orientation; and that the mass present at least one void space extending substantially between the first mass face and the second mass face for receiving a respective electrical connection lead in the installed orientation.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for effecting an improved electrical connection between a component and electrical circuitry on a substrate in an installed orientation; said component presenting at least one electrical connection lead for establishing said electrical connection between said component and said electrical circuitry in said installed orientation; each respective connection lead of said at least one electrical connection lead being a rod-shaped structure having a cross section and extending a length from said component toward said substrate in said install orientation; said length being significantly greater than any dimension of said cross section; the apparatus comprising: a mass of compressible dielectric material substantially fixedly situated between said component and said substrate in said installed orientation; said mass being in substantially surrounding relation substantially around each said respective connection lead substantially along said length; said substrate generally defining an open inter-component volume therebetween in said installed orientation; said mass substantially filling said inter-component volume in said installed orientation.

2. An apparatus as recited in claim 1, wherein said at least one electrical connection lead piercingly engages said mass in said installed orientation.

3. An apparatus as recited in claim 1, wherein said mass substantially abuts said component by a first mass face in said installed orientation, and wherein said mass substantially abuts said substrate by a second mass face in said installed orientation; said mass presenting at least one void space extending substantially between said first mass face and said second mass face; a respective said at least one void space receiving substantially all of said length of a respective said at least one electrical connection lead in said installed orientation.

4. An apparatus as recited in claim 2, wherein said mass substantially abuts said component by a first mass face in said installed orientation, and wherein said mass substantially abuts said substrate by a second mass face in said installed orientation; said mass presenting at least one void space extending substantially between said first mass face and said second mass face; a respective said at least one void space receiving substantially all of said length of a respective said at least one electrical connection lead in said installed orientation.

5. A method for effecting an improved electrical connection between a component and electrical circuitry on a substrate; said component presenting at least one electrical connection lead for establishing said electrical connection between said component and said electrical circuitry in an installed orientation; each respective connection lead of said at least one electrical connection lead being a rod-shaped structure having a cross section and extending a length from said component toward said substrate in said installed orientation; said length being significantly greater than any linear dimension of said cross section; the method comprising the steps of:
  (a) in no particular order:
    (1) providing a mass of compressible dielectric material; and
    (2) orienting said component and said substrate in a spaced relation;
  (b) situating said mass between said component and said substrate;
  (c) urging said component and said substrate together toward said installed orientation; and
  (d) effecting a coupling action with said at least one electrical connection lead to electrically engage said component and said substrate in said installed orientation with said mass in substantially surrounding relation substantially around each said respective connection lead substantially along said length; said mass being substantially in register with said component; said component and said substrate generally defining an open inter-component volume therebetween in said installed orientation; said mass substantially filling said inter-component volume in said installed orientation.

6. A method for effecting an improved electrical connection between a component and electrical circuitry on a substrate as recited in claim 5, wherein said situating step includes affixing said mass to one of said component and said substrate.

7. A method for effecting an improved electrical connection between a component and electrical circuitry on a substrate as recited in claim 5 further comprising the step of said at least one electrical connection lead piercingly engaging said mass during said urging step.

8. A method for effecting an improved electrical connection between a component and electrical circuitry on a substrate as recited in claim 5, wherein said mass substantially abuts said component by a first mass face in said installed orientation, and wherein and said mass substantially abuts said substrate by a second mass face in said installed orientation; said mass presenting at least one void space extending substantially between said first mass face and said second mass face; further comprising the step of a respective said at least one void space receiving substantially all of said length of a respective said at least one electrical connection lead in said installed orientation.

9. An apparatus for effecting an improved electrical connection between a component and electrical circuitry on a substrate in an installed orientation; said component presenting at least one electrical connection lead for establishing said electrical connection between said component and said electrical circuitry separated by an installation distance in said installed orientation; each respective connection lead of said at least one electrical connection lead being a rod-shaped structure and extending a length from said component toward said substrate in said installed orientation; said length being significantly greater than any linear dimension of said cross section; the apparatus comprising: a mass of compressible dielectric material captively compressed between said component and said substrate to a compressed dimension substantially equal with said installation distance; said mass being in substantially surrounding relation substantially around each said respective connection lead substantially along said length; said mass being substantially in register with said component; said component and said substrate generally defining an open inter-component volume therebetween in said installed orientation; said mass substantially filling said inter-component volume in said installed orientation.

10. An apparatus as recited in claim 9, wherein said at least one electrical connection lead piercingly engages said mass in said installed orientation.

11. An apparatus recited in claim 9, wherein said mass substantially abuts said component by a first mass face in said installed orientation, and wherein said mass substantially abuts said substrate by a second mass face in said installed orientation; said mass presenting at least one void space extending substantially between said first mass face and said second mass face; a respective said at least one void space receiving substantially all of said length of a respective said at least one electrical connection lead in said installed orientation.

12. An apparatus as recited in claim 10, wherein said mass substantially abuts said component by a first mass face in said installed orientation, and wherein said mass substantially abuts said substrate by a second mass face in said installed orientation; said mass presenting at least one void space extending substantially between said first mass face and said second mass face; a respective said at least one void space receiving substantially all of said length of a respective said at least one electrical connection lead in said installed orientation.

* * * * *